United States Patent [19]

Nakasuji et al.

[11] 4,218,621
[45] Aug. 19, 1980

[54] ELECTRON BEAM EXPOSURE APPARATUS

[75] Inventors: Mamoru Nakasuji; Toshiaki Shinozaki, both of Yokohama, Japan

[73] Assignee: Vlsi Technology Research Association, Japan

[21] Appl. No.: 915,869

[22] Filed: Jun. 15, 1978

[30] Foreign Application Priority Data

Jun. 15, 1977 [JP] Japan ................................ 52/70626
Jun. 15, 1977 [JP] Japan ................................ 52/70628

[51] Int. Cl.² ........................................... A61K 27/02
[52] U.S. Cl. ............................. 250/492 A; 250/396 R; 250/492 R
[58] Field of Search ........... 250/492 A, 492 B, 492 R, 250/396

[56] References Cited

U.S. PATENT DOCUMENTS 3,491,236  1/1970  Newberry ...................... 250/492 A
3,876,883  4/1975  Broers .............................. 250/492 A
4,117,339  9/1978  Wolfe ............................... 250/492 A

OTHER PUBLICATIONS

"Design & Optimization of Magnetic Lenses . . . " by E. Munro, Journal of Vacuum Science Tech., vol. 12, No. 6, Nov./Dec., 1975, pp. 1146–1150.

Primary Examiner—Harold A. Dixon
Attorney, Agent, or Firm—Finnegan, Henderson, Farabow, Garrett & Dunner

[57] ABSTRACT

Disclosed is an electron beam exposure apparatus which comprises a first deflection system for deflecting an electron beam emitted from an electron gun and an objective electron lens for converging the deflected electron beam to apply the beam to a workpiece. Interposed between the objective lens and the workpiece is a second deflection system for deflecting the electron beam in parallel with the optical axis of the apparatus.

13 Claims, 1 Drawing Figure

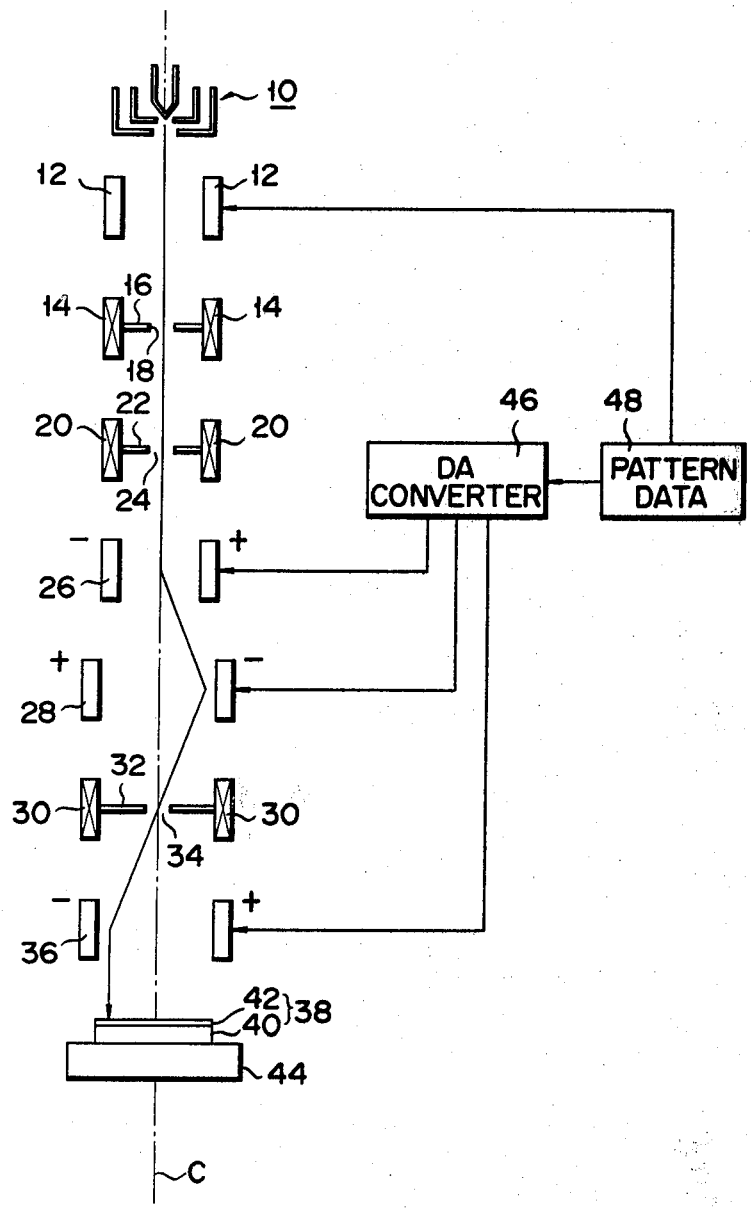

ELECTRON BEAM EXPOSURE APPARATUS

BACKGROUND OF THE INVENTION

This invention relates to an electron beam exposure apparatus, more specifically to an electron beam exposure apparatus in which a deflected electron beam is projected on a workpiece in parallel with the optical axis of the apparatus.

In drawing a high-accuracy desired pattern on a workpiece by using an electron beam exposure apparatus, it is desired that an electron beam should be applied to the workpiece at right angles thereto. Otherwise it is impossible to draw a high-accuracy pattern since the workpiece has an uneven surface. Recently, a system has been proposed in which a deflecting device is interposed between two mask plates each having an aperture and the size of the electron beam is allowed to be made variable. In this system the electron beam can be projected as a spot having a shape corresponding to the shape of the aperture on a plane perpendicular to the optical axis, but the electron beam is, if deflected aslant, projected on such plane as a spot having a distorted shape. Therefore, it is necessary to project the electron beam on the workpiece always in parallel with the optical axis. Thereupon, according to the conventional method, the electron beam applied to the workpiece, even during deflection, is paralleled with the optical axis of the apparatus by using a telecentric lens system for the object lens, whereby the electron beam is applied at right angles to the workpiece disposed at right angles to the optical axis. This telecentric lens system, however, is special and very expensive. The diameter of the aperture of the telecentric lens is required to be equal to the sum of the deflection width of the electron beam and the numerical aperture (NA) of a projection lens. In this case, the exposure current is applied only at a value determined by NA, whereas the aberration is in proportion to the cube of the diameter of the aperture, that is, the deflection width plus NA. Consequently, the exposure current is small and the aberration is substantial, which is not very practical.

SUMMARY OF THE INVENTION

Accordingly, an object of this invention is to provide an electron beam exposure apparatus with a relatively simple construction capable of applying a deflected electron beam to a workpiece in parallel with the optical axis of the apparatus.

Another object of the invention is to provide an electron beam exposure apparatus capable of high-accuracy exposure with a large exposure current and less aberration.

These and other objects which will be apparent from the following detailed description have been achieved according to the invention by an electron beam exposure apparatus comprising an electron gun to produce an electron beam, a first deflection system for deflecting the electron beam, an objective electron lens for converging the deflected electron beam, and a second deflection system next to the objective electron lens for deflecting the converged electron beam in parallel with the optical axis of the apparatus and applying the electron beam to a workpiece disposed at right angles to the optical axis.

BRIEF DESCRIPTION OF THE DRAWING

The accompanying drawing shows a schematic view illustrating an embodiment of the electron beam exposure apparatus of this invention.

DETAILED DESCRIPTION OF THE PREFERRED EMBODIMENTS

This invention will now be described in detail with reference to the accompanying drawing. For the simplicity of illustration, there are shown only one-dimensional deflecting means. The illustrated apparatus includes an electron gun 10 to emit an electron beam. The electron beam emitted from the electron gun 10 is converged by an electron lens 14, passed through an aperture 18 of a mask plate 16 built in the electron lens 14, and reaches a condensing electron lens 20 as a beam with the sectional shape corresponding to the plane shape of the aperture 18. The electron beam is further converged by the electron lens 20, passed through an aperture 24 of a mask plate 22 built in the electron lens 20, and applied to a workpiece 38, such as an electroresist film 40 formed on a wafer 42, mounted on a support plate 44 at right angles to the optical axis C of the apparatus, through deflecting electrodes 26 and 28, an objective electron lens 30, and post-deflection electrodes 36.

The deflecting electrodes 26 and 28 are arranged in parallel with each other, the inter-electrode distance of the electrodes 28 being larger than that of the electrodes 26. Inverse voltages are applied to the electrodes 26 and 28. If positive and negative voltages are applied to the individual electrodes 26 and 28 as illustrated, for example, an electron beam B incident upon the electrodes 26 is deflected in a direction at a fixed angle by an electric field formed between the electrodes 26, and is rendered incident upon the electrodes 28. Then, the electron beam is deflected by the electrodes 28 in a direction opposite to the deflection of the electrodes 26 at a fixed angle corresponding to the level of voltage applied to the electrodes 28, and is rendered incident always upon the center of the objective electron lens 30. Any undersired electron beam components are interrupted by a mask plate 32 built in the objective electron lens 30, while the desired component is passed through an aperture 34 of a mask plate 32, condensed, and rendered incident upon the post-deflection electrodes 36.

Applied to the post-deflection electrodes 36 is voltage in a direction opposite to the direction of the voltage applied to the deflecting electrodes 28. The electron beam B incident upon the electrodes 36 at an angle has its optical axis parallel with the optical axis C of the apparatus, and is applied to the workpiece 38 at right angles thereto.

The reflecting electrodes 26 and 28 are arranged in parallel with each other, as already mentioned, so that deflection at a desired angle may easily be secured by maintaining a fixed proportional relation between the values of voltages applied to the electrodes 26 and 28.

The deflecting electrodes 26, 28 and 26 operate engagedly with one another. For example, a DA converter 46 reads information as to the position of a pattern from a pattern data 48, when a predetermined voltage from the DA converter is applied to each of the electrodes 26, 28 and 36. In this case it is convenient to apply the same amount of voltage to each of the electrodes 26, 28 and 36. Therefore the length and inter-electrode distance of each of the electrodes 26 and 28 are so arranged as to allow the electron beam always to pass the center of the aperture 34, and the length and inter-electrode distance of the electrode 36 are so arranged to allow the electron beam to be projected on the workpiece 38 at right angles thereto by applying the same amount of voltage to the electrode 36 as applied to the electrodes 26 and 28. It is well known in the art that actual scanning is performed by the united operation of blanking electrodes 12 connected with the pattern data 48.

According to the thus constructed apparatus, the electron beam in parallel with the optical axis C may easily be obtained by only interposing a second deflection system (post-deflection electrodes 36) between the objective lens 30 and the workpiece 38. Since no special telecentric lens is required for the objective lens 30, the apparatus may be quite cheap. Further, the post-deflection electrodes 36 amy be controlled very easily-engagedly with the deflecting electrodes 26 and 28. Moreover, the diameter of the aperture 34 of the objective lens 30 may be nearly ⅓ of that of the telecentric lens, thereby substantially reducing the aberration and facilitating the flow of a large exposure current. Where a relatively large aberration is permitted, the outside dimensions of the objective lens may be halved as compared with the case of the telecentric lens, thereby ensuring the compactness of the apparatus.

Although only the one-dimensional deflection control has been described with respect to the above embodiment, this invention may also apply to the case of two-dimensional deflection control. The deflecting means may be electrostatic, electromagnetic, or any other suitable deflecting means. Further the electron lens system applying the electron beam emitted from the gun 10 to the deflecting electrode 14 may include two mask plates each built-in electron lenses and having an aperture. In this electron lens system the size of the electron beam emitted from the gun 10 can be made variable.

What we claim is:

1. An electron beam exposure apparatus comprising:
   an electron gun to produce an electron beam along an optical axis through said apparatus;
   a first deflection system for deflecting said electron beam at an angle to said optical axis, said first deflection system including first deflecting electrodes for deflecting the incident electron beam in one direction and second deflecting electrodes for deflecting the deflected electron beam in a direction opposite to said one direction to pass said electron beam through the center of an objective electron lens;
   said objective electron lens receiving and converging the electron beam deflected by said first deflection system and forming a final latent image; and
   a second single deflection system next to said objective electron lens for deflecting said converged and deflected electron beam from an angle with the optical axis of said apparatus to parallel with said optical axis and applying said electron beam directly to a workpiece disposed at right angles to said optical axis.

2. An apparatus according to claim 1, wherein said first and second deflecting electrodes are arranged in parallel with each other.

3. An apparatus according to claim 2, wherein said second deflection system includes deflecting electrodes.

4. An apparatus according to claim 1 comprising an electron lens system for converging the electron beam emitted from said electron gun to render said electron beam incident upon said first deflection system.

5. An apparatus according to claim 4 comprising blanking electrodes for blanking the electron beam emitted from said electron gun between said electron gun and said electron lens system.

6. An apparatus according to claim 1 comprising a means for engagedly controlling said first and second deflection system.

7. An electron beam exposure apparatus comprising:
   an electron gun to produce an electron beam along an optical axis through said apparatus;
   a first deflection system for deflecting said electron beam at an angle to said optical axis;
   means including two mask plates each having an aperture and a deflecting system between said mask plates for allowing the size of the electron beam from said electron gun to be made variable and applying the electron beam to said first deflection system;
   an objective electron lens for receiving and converging the deflected electron beam; and
   a second single deflection system next to said objective electron lens for deflecting said converged and deflected electron beam from an angle with the optical axis of said apparatus to parallel with said optical axis and applying said electron beam to a workpiece disposed at right angles to said optical axis.

8. An apparatus according to claim 7, wherein said first deflection system includes first deflecting electrodes for deflecting the incident electron beam in one direction and second deflecting electrodes for deflecting the deflected electron beam in a direction opposite to said one direction to pass said electron beam through the center of said objective electron lens.

9. An apparatus according to claim 8, wherein said first and second deflecting electrodes are arranged in parallel with each other.

10. An apparatus according to claim 9, wherein said second deflection system includes deflecting electrodes.

11. An apparatus according to claim 7 comprising an electron lens system for converging the electron beam emitted from said electron gun to render said electron beam incident upon said first deflection system.

12. An apparatus according to claim 11 comprising blanking electrodes for blanking the electron beam emitted from said electron gun between said electron gun and said electron lens system.

13. An apparatus according to claim 7 comprising a means for engagedly controlling said first and second deflection systems.

* * * * *